US008716150B1

United States Patent
Sun et al.

(10) Patent No.: US 8,716,150 B1
(45) Date of Patent: May 6, 2014

(54) METHOD OF FORMING A LOW-K DIELECTRIC FILM

(71) Applicant: GLOBALFOUNDRIES Inc., Grand Cayman (KY)

(72) Inventors: Zhiguo Sun, Halfmoon, NY (US); Songkram Srivathanakul, Waterford, NY (US); Huang Liu, Mechanicville, NY (US); Hung-Wei Liu, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/860,603

(22) Filed: Apr. 11, 2013

(51) Int. Cl.
*H01L 21/469* (2006.01)
*H01L 21/31* (2006.01)

(52) U.S. Cl.
USPC .......... 438/778; 438/710; 438/758; 438/781; 438/788; 257/635; 257/640; 257/642; 257/E21.277

(58) Field of Classification Search
None
See application file for complete search history.

(56) References Cited

U.S. PATENT DOCUMENTS

| 6,410,462 B1* | 6/2002 | Yang et al. .................... 438/788 |
| 6,565,719 B1* | 5/2003 | Lairson et al. ............ 204/192.16 |
| 6,878,641 B2* | 4/2005 | Hendricks .................... 438/758 |
| 7,135,402 B2 | 11/2006 | Lin et al. |
| 7,381,659 B2* | 6/2008 | Nguyen et al. ................ 438/778 |
| 7,629,272 B2 | 12/2009 | Waldfried et al. |

* cited by examiner

*Primary Examiner* — Telly Green
*Assistant Examiner* — Khanh Duong
(74) *Attorney, Agent, or Firm* — Steven Wernicki, Esq.; Erica M. Hines, Esq.; Heslin Rothenberg Farley & Mesiti P.C.

(57) ABSTRACT

Methods of forming a semiconductor device are provided. The methods include, for example, forming a low-k dielectric having a continuous planar surface, and, after forming the low-k dielectric, subjecting the continuous planar surface of the low-k dielectric to an ethylene plasma enhanced chemical vapor deposition (PECVD) treatment.

20 Claims, 7 Drawing Sheets

METHOD OF FORMING A LOW-K DIELECTRIC FILM

FIELD OF THE INVENTION

The present invention generally relates to methods of forming semiconductor devices, and more particularly, to methods of forming semiconductor devices having low-k dielectric films.

BACKGROUND OF THE INVENTION

Low-k dielectrics are those having a smaller dielectric constant (which represents the ratio of the permittivity of a material divided by permittivity of vacuum) relative to silicon dioxide ($SiO_2$), which has a dielectric constant of 3.9. They can be useful as, e.g. intermetal dielectrics, IMDs, and as interlayer dielectrics, ILDs In digital circuits, dielectrics separate conducting components (e.g., wire interconnects and transistors) from one another. As the size of circuit elements becomes smaller, semiconductor components have scaled, and so have dielectrics. With scaling, resistance capacitance (RC) delay time has increasingly dominated circuit performance. In some circumstances, dielectrics have thinned to the point where, e.g., charge build up and crosstalk adversely affect the performance of semiconductor devices. By replacing traditional dielectrics such as silicon dioxide with low-k dielectrics, RC delay/parasitic capacitance can be reduced, thereby enabling faster switching speeds and lower heat dissipation. Thus, in the semiconductor fabrication industry, there has been an interest in incorporating low-k dielectric materials into semiconductors as a strategy to allow for continued scaling of microelectronic devices.

However, low-k dielectrics can present problems during downstream processing. For example, integrating low-k dielectrics successfully into a reliable CMOS device manufacturing process proves to be extremely difficult due to the dielectric film having low resistance to the downstream process-induced damage (including, e.g., polishing, wet processes, ashing, etching, and preclean plasma damage during, e.g., copper diffusion barrier deposition).

Thus, a need exists for improved methods of forming semiconductor devices incorporating low-k dielectric films that can better withstand downstream processing.

While certain aspects of conventional technologies have been discussed to facilitate disclosure of the invention, Applicants in no way disclaim these technical aspects, and it is contemplated that the claimed invention may encompass one or more of the conventional technical aspects discussed herein.

In this specification, where a document, act or item of knowledge is referred to or discussed, this reference or discussion is not an admission that the document, act or item of knowledge or any combination thereof was, at the priority date, publicly available, known to the public, part of common general knowledge, or otherwise constitutes prior art under the applicable statutory provisions; or is known to be relevant to an attempt to solve any problem with which this specification is concerned.

SUMMARY OF THE INVENTION

Briefly, the present invention satisfies the need for improved methods of forming semiconductor devices incorporating low-k dielectric films that can better withstand downstream processing. It has been found that downstream processing increases the effective dielectric constant. Embodiments of the invention counter the effects of downstream processing by, for example, providing a low-k dielectric with a reduced dielectric constant, and by providing semiconductor devices incorporating the improved low-k dielectric.

The present invention may address one or more of the problems and deficiencies of the art discussed above. However, it is contemplated that the invention may prove useful in addressing other problems and deficiencies in a number of technical areas. Therefore, the claimed invention should not necessarily be construed as limited to addressing any of the particular problems or deficiencies discussed herein.

Certain embodiments of the presently-disclosed methods of forming a semiconductor device have several features, no single one of which is solely responsible for their desirable attributes. Without limiting the scope of these methods as defined by the claims that follow, their more prominent features will now be discussed briefly. After considering this discussion, and particularly after reading the section of this specification entitled "Detailed Description of the Invention," one will understand how the features of the various embodiments disclosed herein provide a number of advantages over the current state of the art. These advantages may include, without limitation, providing improved methods of forming semiconductor devices by, for example, incorporating improved low-k dielectrics having reduced dielectric constants.

These and other features and advantages of this invention will become apparent from the following detailed description of the various aspects of the invention taken in conjunction with the appended claims and the accompanying drawings.

DETAILED DESCRIPTION OF THE INVENTION

Figure 1:
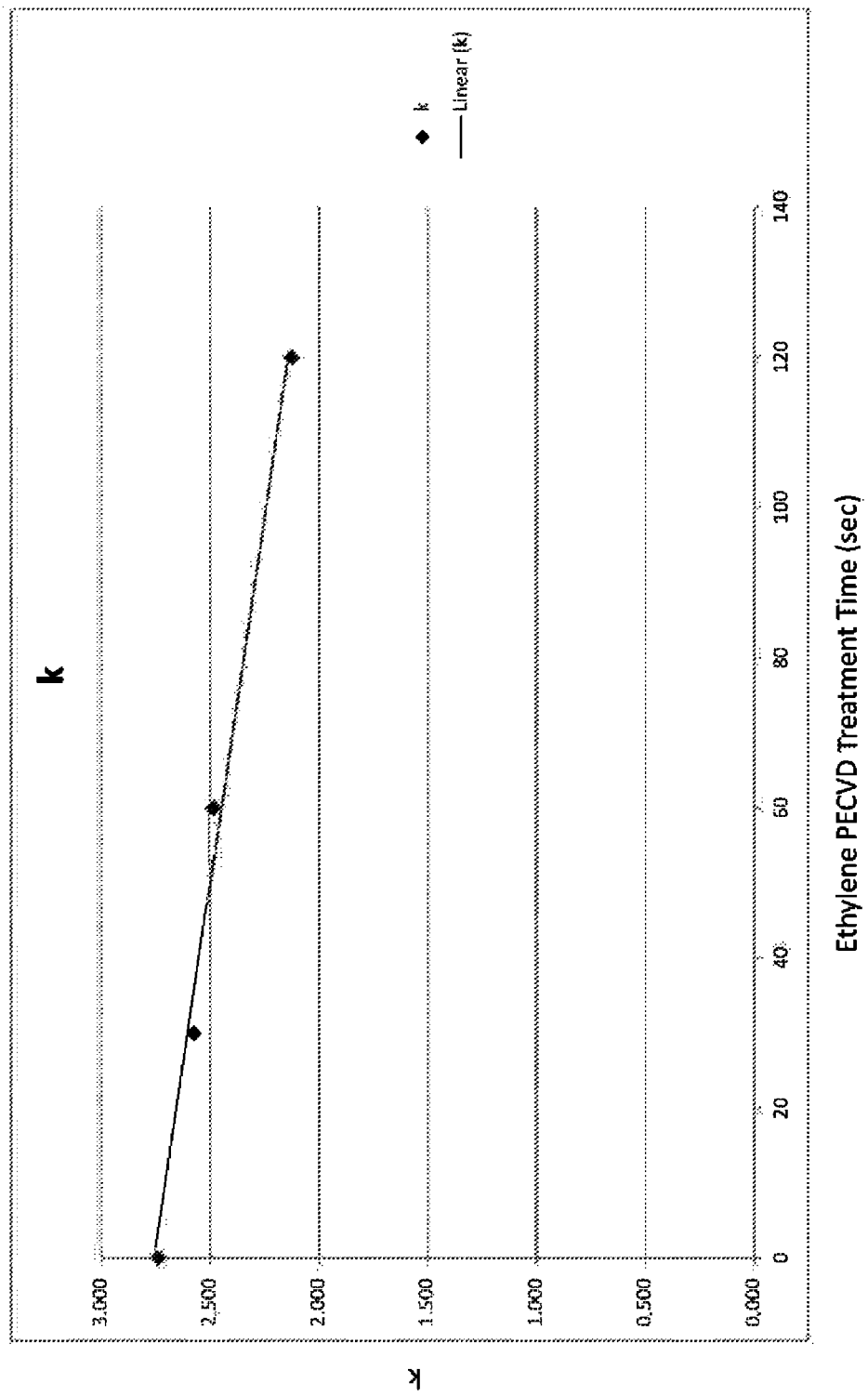
FIG. 1 is a chart displaying the linear relationship between dielectric constant (k) and ethylene PECVD treatment time.

The present invention is generally directed to methods of forming semiconductor devices, and more particularly, to methods of forming semiconductor devices having a low-k dielectric.

Although this invention is susceptible to embodiment in many different forms, certain embodiments of the invention are shown and described. It should be understood, however, that the present disclosure is to be considered as an exemplification of the principles of this invention and is not intended to limit the invention to the embodiments illustrated.

In one aspect, the invention provides a method of forming a semiconductor device. The method includes: forming a low-k dielectric having a continuous planar surface where the formed low-k dielectric has a dielectric constant $k_a$; and, after forming the low-k dielectric, subjecting the continuous planar surface of the low-k dielectric to an ethylene plasma enhanced chemical vapor deposition (PECVD) treatment.

In various embodiments, the forming a low-k dielectric step is performed during a process for forming electrical interconnect structures for a semiconductor device, as described, for example, in U.S. Pat. No. 7,629,272. The low-k dielectric may be formed (e.g. deposited or coated) on a substrate.

Non-limiting examples of processes that may be used to form the low-k dielectric film include chemical vapor deposition (CVD), plasma enhanced chemical vapor deposition (PECVD), high density PECVD, photon assisted CVD, plasma-photon assisted CVD, cryogenic CVD, chemical assisted vapor deposition, hot-filament CVD, CVD of a liquid polymer precursor, deposition from supercritical fluids, transport polymerization ("TP"), spin coating, dip coating, Langmuir-blodgett self-assembly, and misting deposition methods.

The formed low-k dielectric may be any art-acceptable dielectric having a dielectric constant $k_a$ less than or equal to 3.5. For example, in some embodiments, the formed low-k dielectric has a dielectric constant $k_a$ of 3.5, 3.4, 3.3, 3.2, 3.1, 3.0, 2.9, 2.8, 2.7, 2.6, 2.5, 2.4, 2.3, 2.2, 2.1, 2.0, or less, including any and all ranges and subranges therein.

As used herein, "low-k dielectric" includes ultra low-k dielectrics (those having a dielectric constant less than or equal to about 2.5), and extreme low-k dielectrics (those having a dielectric constant less than or equal to about 2.0).

In some embodiments, the low-k dielectric includes a material which is, or has as a precursor, a silicon-containing compound which contains silicon, carbon, oxygen and hydrogen atoms. That is, in these embodiments, the low-k dielectric contains the silicon-containing compound, or the low-k dielectric is formed using the silicon-containing compound as a precursor material.

In some embodiments, the low-k dielectric includes a material which is, or has as a precursor, a material selected from diethoxymethylsilane (for example, commercially available DEMS, from Air Products) and octamethylcyclotetrasiloxane (for example, commercially available OMCTS, from Air Liquide).

In some embodiments, the low-k dielectric includes a material which is, or has as a precursor, a material selected from: organo silicate glass (OSG), polyarylene ether, hydrogen silsesquioxane (HSQ), methyl silsesquioxane (MSQ), polysilsequioxane, polyimide, benzocyclobutene, polytetrafluoroethylene (PTFE), and fluorinated silicate glass (FSG). Additional suitable low-k dielectrics are described, for example, in U.S. Pat. No. 7,135,402.

In some embodiments, the formed low-k dielectric further includes a porogen material.

In some embodiments, the porogen material may include, inter alia, a hydrocarbon material, labile organic group, solvent, decomposable polymer, surfactant, dendrimer, hyperbranched polymer, or polyoxyalkylene compound, or any combination thereof.

In embodiments where the low-k dielectric includes a porogen material, the porogen material may be completely or partially removed during one or more processing steps (e.g., curing) subsequent to the low-k dielectric formation step.

In some embodiments, the method of forming a semiconductor device includes a curing step. In some embodiments, a curing step is performed on the low-k dielectric after forming the low-k dielectric and prior to the ethylene PECVD treatment. More particularly, in some embodiments, at least the continuous planar surface of the low-k dielectric is subjected to a curing treatment. The curing step, where present, may include any art-accepted curing treatment. For example, in some embodiments, the curing step may include ultraviolet (UV) curing, vacuum ultlraviolet (VUV) curing, and/or thermal curing.

In particular embodiments, the curing step includes subjecting the continuous planar surface of the low-k dielectric to UV curing.

In some embodiments, the curing step may increase the crosslinking density of the low-k dielectric.

In some embodiments, the curing step may be carried out such that at least a portion of porogen material, where present, is removed from the low-k dielectric. In embodiments where only a portion of porogen material, where present, is removed, subsequent curing steps may optionally be performed during semiconductor processing to remove essentially all remaining porogen material.

In some embodiments, the curing step is carried out such that essentially all of the porogen material, where present, is removed.

In some embodiments, the removal of porogen material during a semiconductor device manufacturing process step, such as curing, causes the formation of pores in the low-k dielectric. The pore-including low-k dielectric may also be referred to as a porous low-k dielectric.

After forming the low-k dielectric, and in various embodiments, ater performing one or more curing steps, the method of the invention includes subjecting the continuous planar surface of the low-k dielectric to an ethylene plasma enhanced chemical vapor deposition (PECVD) treatment.

As used herein, "continuous planar surface" refers generally to an uninterrupted flat surface. For purposes of the invention, a low-k dielectric surface may be referred to as a continuous planar surface regardless of whether the low-k dielectric is porous or non-porous, and regardless of whether pores are present at the surface. However, where one or more recessed features have been created in a low-k dielectric (e.g., vias, trenches, etc.), the surface of the low-k dielectric would not be considered to be a continuous planar surface, because the surface would, at the least, lack continuity. Recessed features may be caused by, for example, one or more plasma etching processes. Plasma etching can also cause, for example, surface roughness on a dielectric, which would result in a non-planar surface. Accordingly, while methods of the invention may include processes to form recessed features in the low-k dielectric, such processes would only be performed after a dielectric having a continuous planar surface has been formed, and after the continuous planar surface of the low-k dielectric has been treated with an ethylene PECVD treatment.

In some embodiments, the average surface roughness of the formed and optionally cured low-k dielectric, prior to ethylene PECVD treatment, is less than or equal to 2.50 nm, for example, in some embodiments, 2.50, 2.45, 2.40, 2.35, 2.30, 2.25, 2.20, 2.15, 2.10, 2.05, 2.00, 1.95, 1.90, 1.85, 1.80, 1.75, 1.70, 1.65, 1.60, 1.55, 1.50, 1.45, 1.40, 1.35, 1.30, 1.25, or 1.20 nm or less, including any and all ranges and subranges therein (e.g., 1.50 to 2.25 nm).

The ethylene PECVD treatment of the inventive methods yields a treated low-k dielectric having a dielectric constant $k_b$. In some embodiments, $k_b < k_a$. In some embodiments, $k_b$ is less than or equal to 2.8. For example, in some embodiments, $k_b$ is 2.8, 2.7, 2.6, 2.5, 2.4, 2.3, 2.2, 2.1, 2.0, 1.9, 1.8, 1.7, 1.6, 1.5, or 1.4, including any and all ranges and subranges therein (e.g., 1.8 to 2.6). In some embodiments, $k_b$ is less than 2.6, for example, less than 2.4.

According to some embodiments of methods of the invention, the percent change between $k_a$ and $k_b$ $$\left(\frac{k_a - k_b}{k_a} \times 100\%\right)$$

is at least 5%. For example, according to such embodiments, if $k_a$ is 3.0, then $k_b$ must be less than or equal to 2.85.

In some embodiments, the percent change between k and k is 3% to 30%, e.g., 3, 4, 5, 6, 7, 8, 9, 10, 11, 12, 13, 14, 15, 16, 17, 18, 19, 20, 21, 22, 23, 24, 25, 26, 27, 28, 29, or 30%, including all ranges and subranges therein (e.g., 5-25%).

The thickness of the treated low-k dielectric may be any desired thickness. In some embodiments, following the ethylene PECVD-treatment, the treated dielectric has an average thickness of 300 to 6,000 Å. For example, in some embodiments, the treated low-k dielectric has an average thickness of 300, 400, 600, 800, 1,000, 1,200, 1,400, 1,600, 1,800, 2,000, 2,200, 2,400, 2,600, 2,800, 3,000, 3,200, 3,400, 3,600, 3,800, 4,000, 4,200, 4,400, 4,600, 4,800, 5,000, 5,200, 5,400, 5,600, 5,800, or 6,000 Å, including any and all ranges and subranges therein (e.g. 1.000 to 5,000 Å, 1,500 to 4,000 Å, 1,600 to 3,000 Å, etc.)

In some embodiments, the ethylene PECVD treatment according to the invention utilizes a noble gas, for example, helium. The ethylene PECVD treatment may use, for example, a reactor pressure of 1 to 10 Torr, for example, 1, 2, 3, 4, 5, 6, 7, 8, 9, or 10 Torr, including any and all ranges and subranges therein (e.g., 4 to 8 Torr). In some embodiments, the ethylene PECVD treatment is performed at a temperature of 200 to 500° C., for example, 200, 250, 300, 350, 400, 450, or 500° C., including any and all ranges and subranges therein (e.g., 300 to 400° C.). The continuous planar surface of the low-k dielectric is subjected to the ethylene PECVD treatment for any desired treatment time. For example, in some embodiments, the continuous planar surface of the low-k dielectric is subjected to the ethylene PECVD treatment for 10 to 250 seconds, for example, for 10, 20, 30, 40, 50, 60, 70, 80, 90, 100, 110, 120, 130, 140, 150, 160, 170, 180, 190, 200, 210, 220, 230, 240, or 250 seconds, including all ranges and subranges therein (e.g., 15 to 200 seconds). The treatment time may be continuous or intermittent.

In some embodiments, the ethylene PECVD treatment results in ethylene penetrating 50-300 Å into the low-k dielectric (e.g., 50, 60, 70, 80, 90, 100, 110, 120, 130, 140, 150, 160, 170, 180, 190, 200, 210, 220, 230, 240, 250, 260, 270, 280, 290, or 300 Å including any and all ranges and subranges therein (e.g., 100-290 Å). In some embodiments, the ethylene PECVD treatment results in ethylene penetrating less than or equal to 300 Å into the low-k dielectric.

In some embodiments, the inventive method includes repeating the forming a low-k dielectric step and the ethylene PECVD treatment step one or more times (e.g., 1, 2, 3 times, etc.). For example, following a first ethylene PECVD treatment step, one or more additional processing steps may be performed. Subsequent to the first forming a low-k dielectric step and the first ethylene PECVD treatment step, and any desirable additional process steps, a second forming a low-k dielectric step may be performed to form a second low-k dielectric, having the same or a different composition to the first, and having its own continuous planar surface. After forming the second low-k dielectric, the continuous planar surface of the second low-k dielectric may be subjected to a second ethylene plasma enhanced chemical vapor deposition (PECVD) treatment.

Methods of the invention may include, or be used together with other semiconductor fabrication processes. For example, following ethylene PECVD treatment, the low-k dielectric may be patterned using conventional lithographic techniques including, e.g., a hard mask, in the process flow. The patterned low-k dielectric material may be coated with, e.g., a barrier/copper seed layer generally employed for subsequent deposition of a copper interconnect structure in the vias/trenches provided by the patterned low-k dielectric layer. The substrate may then be subjected to a chemical mechanical polish process for planarizing the patterned copper surface, followed by any additional desirable processing.

EXAMPLES

The invention will now be illustrated, but not limited, by reference to the specific embodiments described in the following examples.

Examples 1-6

For Examples 1-6, low-k dielectric films were deposited using a commercial 300 mm Plasma Enhanced Chemical Vapor Deposition (PECVD) system by simultaneously admixing a precursor containing C, H, Si, O and a hydrocarbon porogen precursor in the chamber and application of 13.56 MHz RF power. Subsequent exposure to UV irradiation in a 300 mm system for 160 seconds at 385° C. resulted in the removal of porogen (CHx phase) to create porosity in the film and therefore a lower k. UV curing also enhanced the mechanical properties due to cross linking of the SiCOH skeleton.

Following low-k dielectric formation and curing, ethylene PECVD treatment was performed on Examples 2-6 for 30-120 seconds using a commercial 300 mm Plasma Enhanced Chemical Vapor Deposition (PECVD) system by a C2H4 plasma diluted with noble gas(es) (He) activated with 13.56 MHz RF power. Ethylene PECVD treatment was performed at 350° C., 6.2 Torr.

The resultant film properties for Examples 1-6 are presented below in Table I. For each example, the dielectric constant (k) value was measured by Capacitance-voltage (C-V) measurements of EOT by KLA-Tencor Quantox tool. The dielectric constant of each film was calculated by combining EOT with physical thickness, using the equation; Physical Thickness=EOT*(dielectric constant/3.9).

TABLE I

| Ex. | Deposition | UV Cure Conditions | Ethylene PECVD Treatment | Avg. Dielectrc Thickness, Å | Thickness Non-Uniformity (49points data) | Reflective Index | Quantox EOT, Å | k by Quantox |
|---|---|---|---|---|---|---|---|---|
| 1 | Low-k dieletric (DEMS as precursor) | 385° C., 160 sec | 0 sec | 1530.16 | 1.01 | 1.3787 | 2181 | 2.736 |
| 2 | Low-k dieletric (DEMS as precursor) | 385° C., 160 sec | 30 sec | 1769.97 | 1.28 | 1.4263 | 2685 | 2,570 |
| 3 | Low-k dieletric (DEMS as precursor) | 385° C., 160 sec | 60 sec | 1909.34 | 1.16 | 1.4895 | 2995 | 2.486 |

TABLE I-continued

| Ex. | Deposition | UV Cure Conditions | Ethylene PECVD Treatment | Avg. Dielectrc Thickness, Å | Thickness Non-Uniformity (49points data) | Reflective Index | Quantox EOT, Å | k by Quantox |
|---|---|---|---|---|---|---|---|---|
| 4 | Low-k dieletric (DEMS as precursor) | 385° C., 160 sec | 60 sec | 1919.19 | 1.10 | 1.4887 | 3011 | 2.485 |
| 5 | Low-k dieletric (DEMS as precursor) | 385° C., 160 sec | 120 sec | 1996.40 | 0.56 | 1.6628 | 3669 | 2.122 |
| 6 | Low-k dieletric (DEMS as precursor) | 385° C., 160 sec | 120 sec | 2000.81 | 0.79 | 1.6631 | 3666 | 2.128 |

As shown above, where Example 1 represents the control, ethylene PECVD treatment reduced the dielectric constant for each of Examples 2-6 according to the invention, thereby making the treated low-k dielectrics more conducive to, and desirable for during downstream processing.

FIG. 1 is a chart displaying the linear relationship between dielectric constant (k) and ethylene PECVD treatment time, where dielectric constants were measured using Quantox, as in Table I above. As illustrated, dielectric constant values decreased as a function of exposure time to ethylene PECVD treatment.

Figure 2:
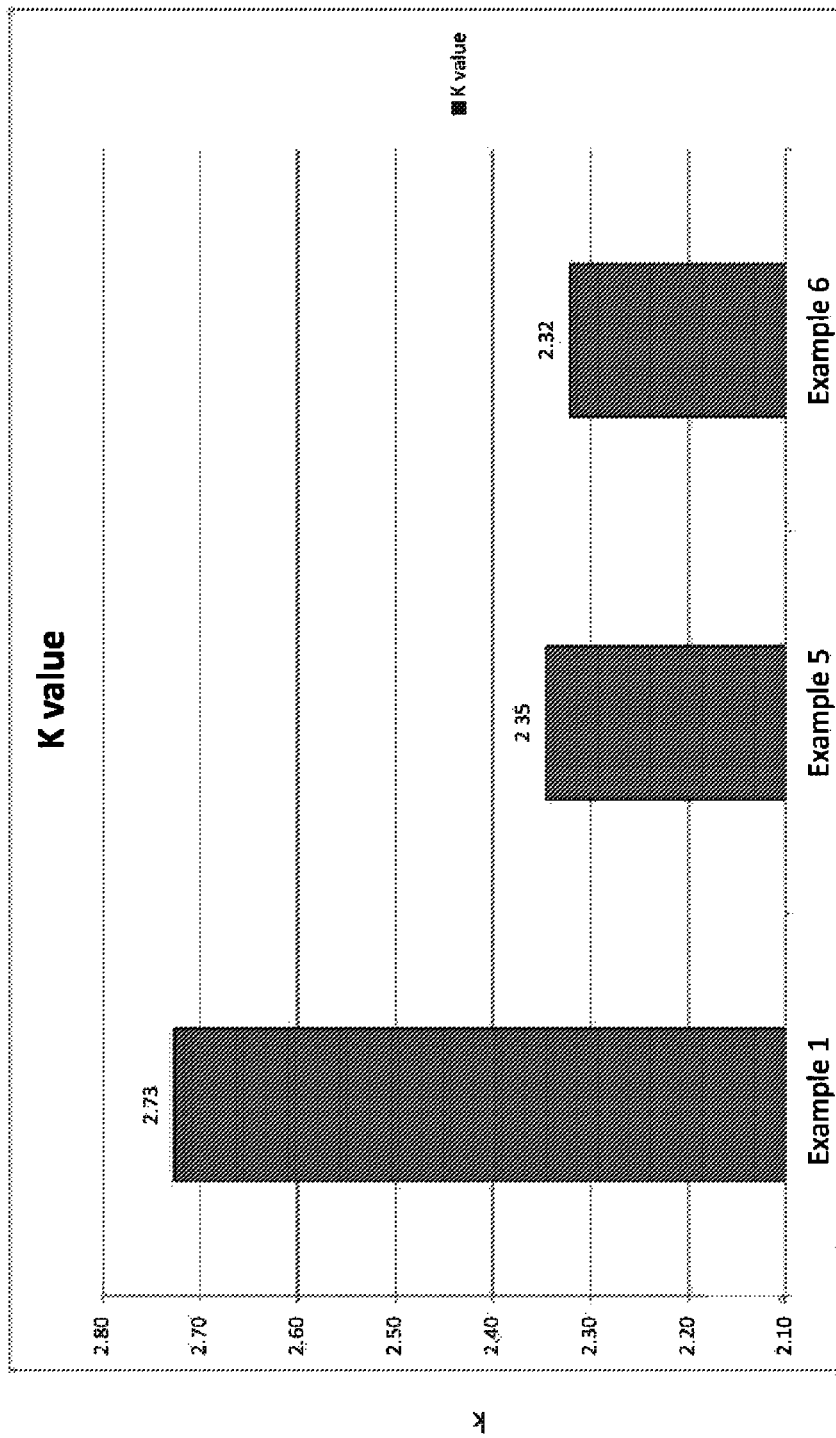
FIG. 2 is a column chart displaying the dielectric constant (k) for Examples 1, 5, and 6.

FIG. 2 is a column chart displaying the dielectric constant (k) for Examples 1, 5, and 6, with k confirmed with metal-insulator-metal (MIM) structure using metal dots. As shown, Examples 5 and 6 according to the invention effectively lowered the dielectric constant from about 2.7 to about 2.3.

Examples 7-9

Examples 7-9 were prepared according to the protocol set forth above for examples 1-6, except that the UV-curing step was omitted, and the dielectric constant of each film was measured by C-V with metal-insulator-metal structure.

The resultant film properties for examples 7-9 are presented below in Table II.

TABLE II

| Ex. | Deposition | Ethylene PECVD Treatment | Avg. Dielectric Thickness, Å | Thickness Non-Uniformity (49points data) | Reflective Index | k, measured by C-V with metal-insulator-metal structure |
|---|---|---|---|---|---|---|
| 7 | Dense low-k dieletric (OMCTS as precursor) | 0 sec | 2806 | 1.87 | 1.4026 | 2.736 |
| 8 | Dense low-k dieletric (OMCTS as precursor) | 30 sec | 2931 | 1.65 | 1.4337 | 2.570 |
| 9 | Dense low-k dieletric (OMCTS as precursor) | 60 sec | 3063 | 1.39 | 1.4811 | 2.486 |

As shown, methods of the invention effectively reduce dielectric constant regardless of whether the formed low-k dielectric is cured before ethylene PECVD treatment.

Examples 10-12

Repairing O2 Plasma Damage

Examples 10-12 were prepared according to the protocol set forth above for examples 1-6, using DEMS as a low-k dielectric precursor.

Of Examples 10-12, Example 10 represents the control, which was not subjected to further treatment following low-k dielectric formation and curing.

Following low-k dielectric formation and curing, Examples 11 and 12 were subjected to oxygen ($O_2$) plasma damage for 18 seconds using a commercial 300 mm Plasma Enhanced Chemical Vapor Deposition (PECVD) system by a O2 plasma diluted with noble gas(es) activated with 13.56 MHz RF power. Example 12, according to the present invention, was subsequently subjected to 30 seconds of ethylene PECVD) treatment, as described above for Example 2.

Figure 3:
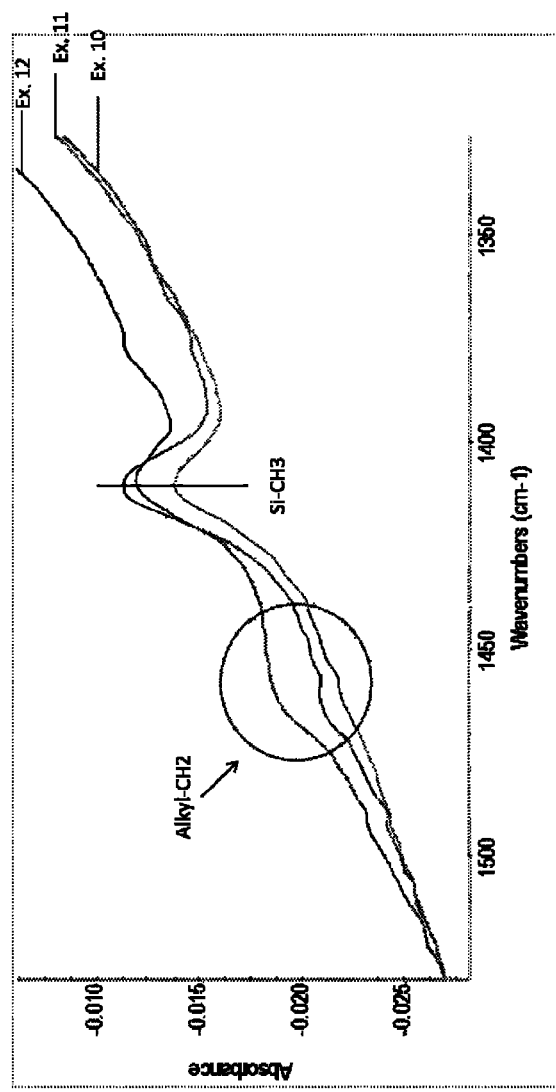
FIGS. 3-5 are charts depicting Fourier Transform Infrared Spectroscopy (FTIR) traces comparisons for Examples 10-12.
Figure 4:
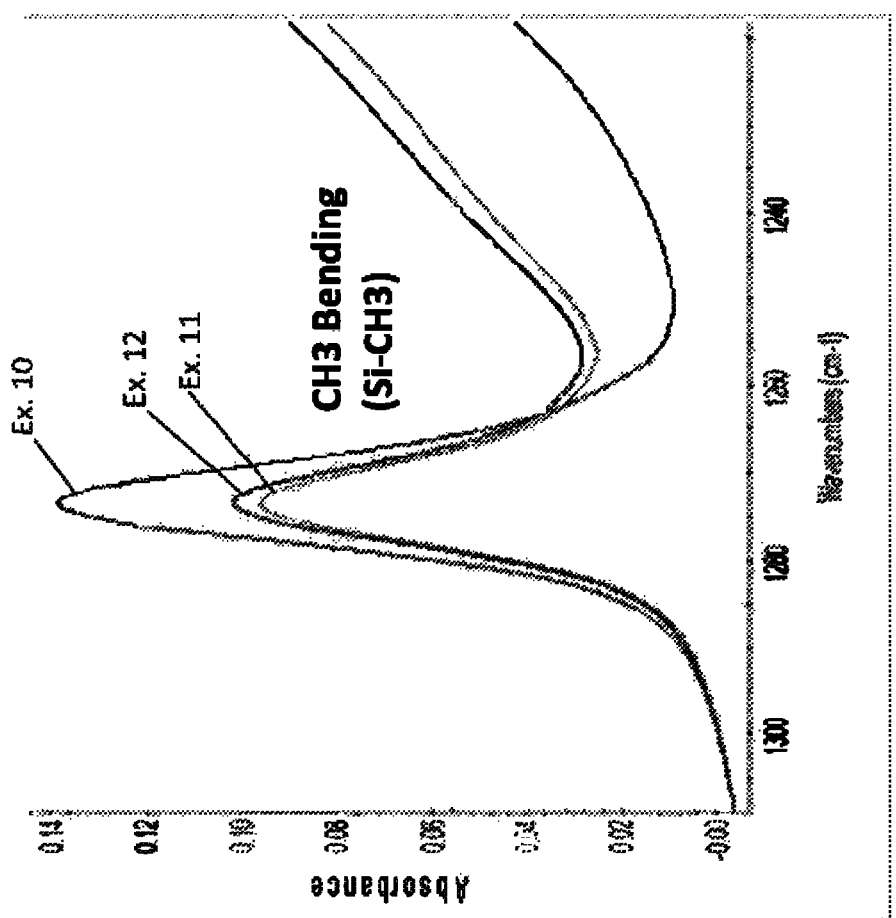
Figure 5:
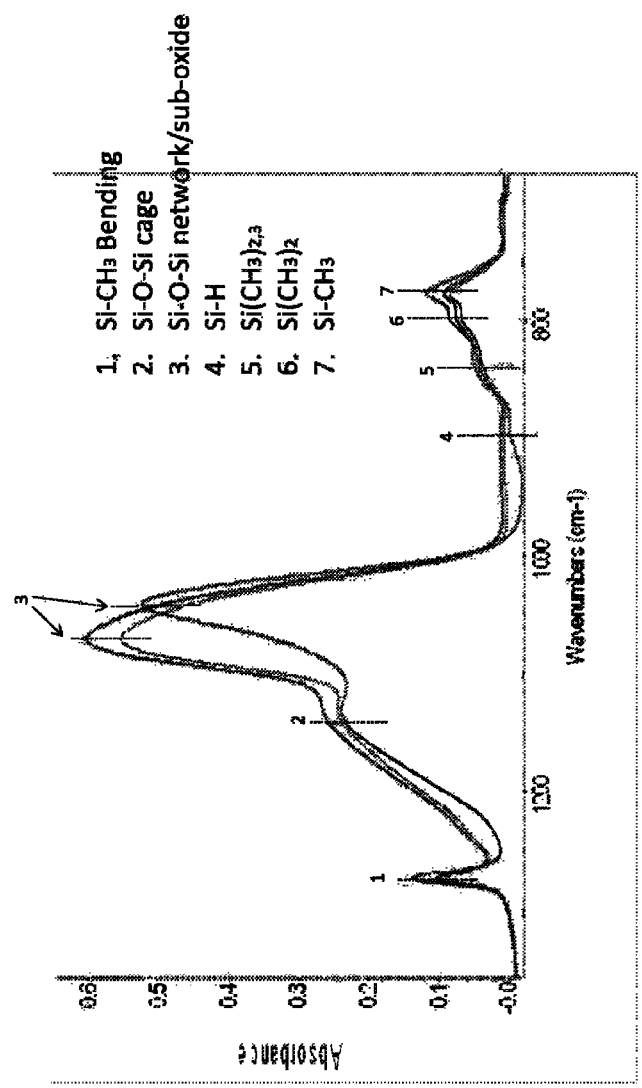

FIGS. 3-5 are charts depicting Fourier Transform infrared Spectroscopy (FTIR) traces comparisons for Examples 10-12, plotted on common scale and normalized to 1 μm thickness. As shown, recoveries for both Alkyl-CH2 and Si—CH3 bonding resulted when the sample of Example 11 was treated with ethylene PECVD treatment according to the present invention to yield Example 12. Thus, exposure to ethylene PECVD treatment favorably restores CHx bondings.

Examples 13-15

Repairing CO2/CO Plasma Damage

Examples 13-15 were prepared according to the protocol set forth above for examples 1-6, using DEMS as a low-k dielectric precursor.

Of Examples 13-15, Example 13 represents the control, which was not subjected to further treatment following low-k dielectric formation and curing.

Following low-k dielectric formation and curing, Examples 14 and 15 were subjected to $CO_2$/CO plasma damage for 20 seconds using a using a commercial 300 mm Reactive Ion Etch (RIE) system by a CO2/CO plasma diluted with noble gas(es). Example 15, an example according to the present invention, was subsequently subjected to 30 seconds of ethylene PECVD treatment, as described above for Example 2.

Figure 6:
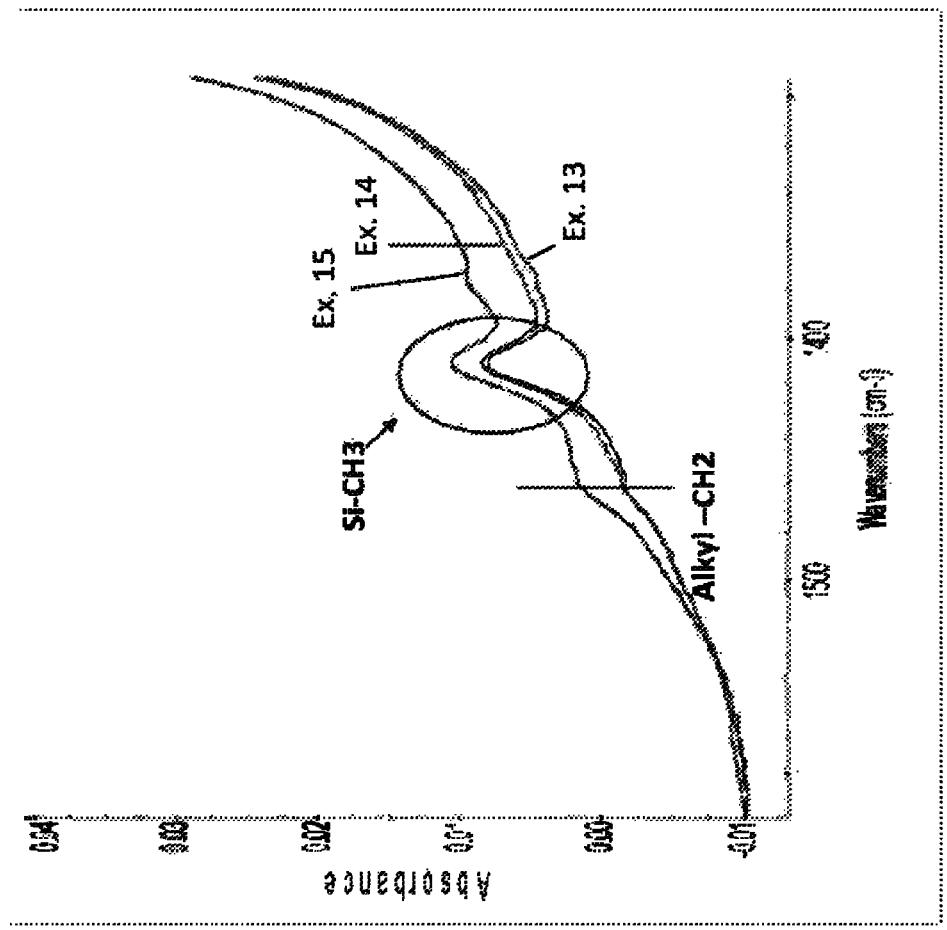
FIG. 6 is a chart depicting a Fourier Transform Infrared Spectroscopy (FTIR) traces comparison for Examples 13-15.

FIG. 6 is a chart depicting a Fourier Transform Infrared Spectroscopy (FTIR) traces comparison for Examples 13-15, plotted on common scale and normalized to 1 μm thickness. As depicted, exposure to ethylene PECVD treatment favorably restores CHx bondings.

Figure 7:
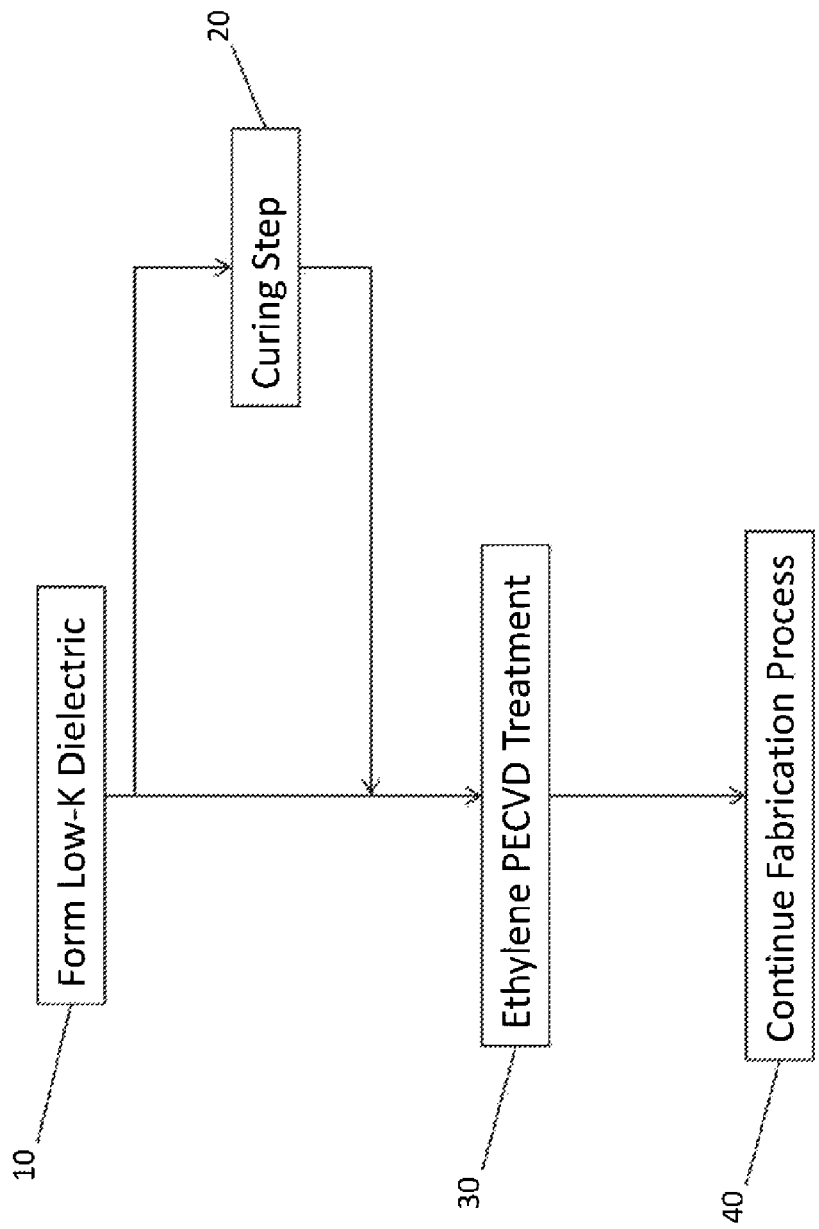
FIG. 7 is a flow chart depicting the steps of an embodiment of the inventive method.

FIG. 7 is a flow chart depicting the steps of an embodiment of the inventive method, including formation step 10 for forming a low-k dielectric having a continuous planar surface, the low-k dielectric having a dielectric constant $k_a$, followed by optional curing step 20, and subsequently ethylene PECVD treatment step 30, for subjecting the continuous planar surface of the low-k dielectric to an ethylene PECVD treatment, which may be followed by further semiconductor fabrication process step(s) 40. Certain embodiments of these inventive methods integrate a low-k dielectric having a reduced dielectric constant into the back end of line of CMOS, thereby allowing for RC delay to be significantly reduced following downstream processing. Some embodiments thus also provide for improved chip performance and reduced chip manufacturing costs.

The terminology used herein is for the purpose of describing particular embodiments only and is not intended to be limiting of the invention. As used herein, the singular forms "a", "an" and "the" are intended to include the plural forms as well unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

As used herein, the terms "comprising" and "including" or grammatical variants thereof are to be taken as specifying the stated features, integers, steps or components but do not preclude the addition of one or more additional features, integers, steps, components or groups thereof. This term encompasses the terms "consisting of" and "consisting essentially of".

The phrase "consisting essentially of" or grammatical variants thereof when used herein are to be taken as specifying the stated features, integers, steps or components but do not preclude the addition of one or more additional features, integers, steps, components or groups thereof but only if the additional features, integers, steps, components or groups thereof do not materially alter the basic and novel characteristics of the claimed composition, device or method.

Where one or more ranges are referred to throughout this specification, each range is intended to be a shorthand format for presenting information, where the range is understood to encompass each discrete point within the range as if the same were fully set forth herein.

While several aspects and embodiments of the present invention have been described and depicted herein, alternative aspects and embodiments may be affected by those skilled in the art to accomplish the same objectives. Accordingly this disclosure and the appended claims are intended to cover all such further and alternative aspects and embodiments as fall within the true spirit and scope of the invention.

The invention claimed is:

1. A method of forming a semiconductor device, said method comprising:

forming a low-k dielectric having a continuous planar surface, the low-k dielectric having a dielectric constant $k_a$; and after forming the low-k dielectric, subjecting the continuous planar surface of the low-k dielectric to an ethylene plasma enhanced chemical vapor deposition (PECVD) treatment.

2. The method according to claim 1, wherein the low-k dielectric comprises a material which is, or has as a precursor, a silicon-containing compound comprising silicon, carbon, oxygen and hydrogen atoms.

3. The method according to claim 2, wherein the low-k dielectric comprises a material which is, or has as a precursor, a material selected from diethoxymethylsilane and octamethylcyclotetrasiloxane.

4. The method according to claim 1, wherein the low-k dielectric comprises a material which is, or has as a precursor, a material selected from: organo silicate glass (OSG), borophosphosilicate glass (BPSG), borosilicate glass (BSG), phosphosilicate glass (PSG), polyarylene ether, hydrogen silesquioxane (HSQ), methyl silsesquioxane (MSQ), polysilsequioxane, polyimide, benzocyclobutene, polytetrafluoroethylene (PTFE), and fluorinated silicate glass (FSG).

5. The method according to claim 2, wherein the low-k dielectric further comprises a porogen material.

6. The method according to claim 5, wherein the porogen material comprises a hydrocarbon material, labile organic group, solvent, decomposable polymer, surfactant, dendrimer, hyper-branched polymer, or polyoxyalkylene compound, or any combination thereof.

7. The method according to claim 1, wherein, after forming the low-k dielectric and prior to the ethylene PECVD treatment, a curing step is performed on the low-k dielectric.

8. The method according to claim 7, wherein the curing step comprises subjecting the continuous planar surface of the low-k dielectric to ultraviolet (UV) curing.

9. The method according to claim 2, wherein the ethylene PECVD treatment yields a treated low-k dielectric having a dielectric constant $k_b$, where $k_b < k_a$.

10. The method according to claim 9, wherein the percent change between $k_a$ and $k_b$ $$\left(\frac{k_a - k_b}{k_a} \times 100\%\right)$$

is at least 5%.

11. The method according to claim 9, wherein $k_a$ is less than 3.

12. The method according to claim 9, wherein $k_b$ is less than 2.6.

13. The method according to claim 12, wherein $k_b$ is less than 2.4.

14. The method according to claim 9, wherein the ethylene PECVD treatment is performed at a pressure of 4 to 8 Torr.

15. The method according to claim 9, wherein the ethylene PECVD treatment is performed at a temperature of 300 to 400° C.

16. The method according to claim 9, wherein the continuous planar surface of the low-k dielectric is subjected to the ethylene PECVD treatment for 15 to 200 seconds.

17. The method according to claim 9, wherein the low-k dielectric comprises a material which is, or has as a precursor, a material selected from diethoxymethylsilane and octamethylcyclotetrasiloxane.

18. The method according to claim 9, wherein, after forming the low-k dielectric and prior to the ethylene PECVD treatment, a curing step is performed on the low-k dielectric.

19. The method according to claim 18, wherein the curing step comprises subjecting the continuous planar surface of the low-k dielectric to ultraviolet (UV) curing.

20. The method according to claim 2, said method comprising repeating the forming a low-k dielectric step and the ethylene PECVD treatment step one or more times.

* * * * *